(12) United States Patent
Baba

(10) Patent No.: US 6,885,956 B2
(45) Date of Patent: Apr. 26, 2005

(54) SEMICONDUCTOR TEST APPARATUS

(75) Inventor: Tadahiko Baba, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 10/477,779

(22) PCT Filed: May 24, 2002

(86) PCT No.: PCT/JP02/05060

§ 371 (c)(1),
(2), (4) Date: Nov. 12, 2003

(87) PCT Pub. No.: WO02/097822

PCT Pub. Date: Dec. 5, 2002

(65) Prior Publication Data

US 2004/0148119 A1 Jul. 29, 2004

(30) Foreign Application Priority Data

May 25, 2001 (JP) ........................................ 2001-157255

(51) Int. Cl.[7] ............................................. G01R 31/28
(52) U.S. Cl. ........................................ 702/83; 714/764
(58) Field of Search .............. 702/81–84; 714/763–766, 714/768

(56) References Cited

U.S. PATENT DOCUMENTS

| | | | | |
|---|---|---|---|---|
| 5,663,967 A | * | 9/1997 | Lindberg et al. ............. | 714/737 |
| 6,067,262 A | * | 5/2000 | Irrinki et al. ................ | 365/201 |
| 6,504,773 B1 | * | 1/2003 | Kobayashi ................... | 365/201 |
| 6,651,202 B1 | * | 11/2003 | Phan .......................... | 714/733 |
| 6,687,861 B1 | * | 2/2004 | Jordan et al. ................ | 714/718 |

FOREIGN PATENT DOCUMENTS

| | | |
|---|---|---|
| JP | 7-130199 | 5/1995 |
| JP | 8-55498 | 2/1996 |

* cited by examiner

*Primary Examiner*—Patrick Assouad
*Assistant Examiner*—Craig Steven Miller
(74) *Attorney, Agent, or Firm*—Muramatsu & Associates

(57) ABSTRACT

There is disclosed a semiconductor test apparatus enabling writing into an information write space of a block including a failure cell into which block writing is inhibited partially or entirely by the bad block mask function and the fail loop back function. A pattern generation block outputs to an output controller a release signal (S4) for releasing the write inhibit instruction defined by an inhibit signal (S3) and a mask signal (SI). When the output controller receives the release signal (S4), the output controller outputs a write enable signal (WE) to an MUT (4).

5 Claims, 6 Drawing Sheets

SEMICONDUCTOR TEST APPARATUS

TECHNICAL FIELD

The present invention relates to a semiconductor test apparatus which tests a memory device such as a flash memory as a device under test, and more particularly to a semiconductor test apparatus having a bad block mask (BBM) function and a fail loop back (FLB) function.

BACKGROUND ART

A semiconductor test apparatus which tests a flash memory or the like as a device under test inputs a test pattern signal to a memory device, and compares a response output signal from the memory device with an expected pattern signal. Further, it detects a mismatch in a comparison result as a failure of a memory cell, and stores failure information (fail data) in a failure analysis memory. In the failure analysis memory is set the same address space as that in the memory device and stored failure information at the same address as an address of a failure cell.

An example of a conventional semiconductor test apparatus will now be briefly described with reference to FIG. 5.

As shown in FIG. 5, the conventional semiconductor test apparatus is constituted by a pattern generation block 1, a waveform formatter/timing generator 2, an output controller 3, a logic comparator 5, and a failure analysis memory 6.

The pattern generation block 1 generates a cycle signal, a waveform control signal and an expected pattern signal as well as an address signal which specifies a write address in a memory device (MUT: Memory device Under Test) 4.

Further, the waveform formatter/timing generator 2 outputs a test pattern signal whose waveform is formatted by the waveform control signal, and also outputs a write enable signal which enables writing of the test pattern signal into the memory device.

It is to be noted that an illustration of a transmission path of the expected pattern signal is omitted in FIG. 5.

Furthermore, the logic comparator 5 compares an output signal outputted from the memory device 4 in response to the input test pattern signal with an expected pattern signal. It detects as a failure cell a mismatch result of the comparison between the expected pattern signal and the response output signal. When the failure cell is detected, the logic comparator 5 outputs a fail signal S2 to a failure analysis memory 6.

The failure analysis memory 6 having the fail signal S2 inputted thereto stores failure information at an address indicated by an address signal.

Meanwhile, in case of testing as a device under test a memory device such as a flash memory in which a memory area is divided into a plurality of blocks, writing information into a part or all of the block including a failure cell is inhibited by a bad block mask function or a fail loop back function.

The bad block mask function and the fail lop back function will now be briefly described with reference to FIG. 6. FIG. 6 typically shows an address space of the memory device. In an example depicted in FIG. 6, a memory area of the memory device is divided into a plurality of blocks. Furthermore, each block is constituted by a memory logic address space in which data or the like is written and an information write space which is a redundant space.

The bad block mask function is a function which inhibits writing information into a block in which a failure cell is detected in advance by a pre-check or the like. Information of the previously detected failure cell (failure information) is held in the failure analysis memory 6. The failure analysis memory 6 outputs a mask signal S1 which inhibits writing in the entire block including that failure cell based on this failure information.

Based on this mask signal S1, writing in an entire area of a second block 42 in the address space depicted in FIG. 6 is inhibited. This write inhibit area also includes an information write space 42a.

Moreover, the fail loop back (FLB) function is a function which inhibits writing into a memory area which is tested after a failure cell in a block including that failure cell when the logic comparator 5 detects the failure cell. The logic comparator 5 which has detected the failure cell outputs a fail signal S2 to the failure analysis memory 6, and also outputs an inhibit signal S3 which inhibits writing into a memory area which is tested after a newly detected failure cell in a block including that failure cell.

Based on this inhibit signal S3, in the address space depicted in FIG. 6, writing into an area after a failure generation address 400 indicated by "f" in a fourth block 44 is inhibited. This inhibit area also includes a part 44a of the information write space.

Incidentally, when again testing the same memory device 4, writing into the entire fourth block 44 including the failure cell is inhibited by the mask signal S1.

Additionally, when one or both of the inhibit signal S3 and the mask signal S1 are inputted, the output controller 3a stops outputting of the write enable signal (WE) to the memory device. In order to realize this function, in the conventional example, the output controller 3a is constituted by a first OR circuit 31, a second OR circuit 32 and a flip-flop 30.

The inhibit signal S3 and the mask signal S2 are inputted to the first OR circuit 31. Further, an output from the first OR circuit 31 and a timing signal from the waveform formatter/timing generator 2 are inputted to the second OR circuit 32. Furthermore, an output of the second OR circuit 32 is inputted to the flip-flop 30 as a reset signal S5, and the write enable signal (WE) is inputted to the same as a set signal.

As a result, when at least one of the inhibit signal S3 and the mask signal S1 is outputted to the first OR circuit 31, a reset signal S5 is inputted to the flip-flop 30, and output of the write enable signal (WE) is stopped. In this manner, writing into a block in which a failure cell is detected in advance or a remaining part of a block in which a failure cell is newly detected during the test is inhibited.

Meanwhile, a redundant space is generally provided in an address space of a memory area of, e.g., a flash memory, and this redundant space is used as an information write space. For example, a flag indicating that a failure cell is included may be written into the information write space of a block in which a failure cell is detected in some cases. Writing the flag in this manner can readily grasp the block including the failure cell.

However, when writing into a part or all of the block including the failure cell is inhibited by the back block mask function or the fail loop back function, writing of a flag or the like into the information write space of such a block is also inhibited. As a result, a write cycle required to write information into the information write space must be added, which generates a problem that processing takes time.

In order to solve the above-described problems, it is therefore an object of the present invention to provide a technique which enables writing information into an information write space of a block including a failure cell, writing into a part or all of which block is inhibited by a bad block mask function or a fail loop back function.

DISCLOSURE OF THE INVENTION

According to the present invention, there is provided a semiconductor test apparatus which tests as a device under test a memory device whose memory area is divided into a plurality of blocks, comprising: a pattern generation block which generates a waveform control signal and an expected pattern signal as well as an address signal specifying a write address in the memory device; a waveform formatter/timing generator which outputs a test pattern signal whose waveform is formatted by the waveform control signal and also outputs a write enable signal which enables writing of the test pattern signal into the memory device; a logic comparator which compares an output signal outputted from the memory device in response to the input test pattern signal with an expected pattern signal, detects a failure cell based on a mismatch of the expected pattern signal and the response output signal and outputs a fail signal, and also outputs an inhibit signal which instructs inhibition of writing into a memory area which is tested after the failure cell in a block in which the failure cell is detected; a failure analysis memory which stores failure information at an address indicated by the address signal, and outputs a mask signal which instructs inhibition of writing into the block in which the failure cell is detected in advance; and an output controller which stops output of the write enable signal to the memory device when one or both of the inhibition signal and the mask signal are inputted, wherein the pattern generation block outputs a release signal which cancels the write inhibit instruction based on the inhibit signal and on the mask signal, and output controller outputs the write enable signal when the release signal is inputted even if one or both of the inhibit signal and the mask signal are inputted.

According to such a semiconductor test apparatus of the present invention, write inhibit processing to the block by the bad block mask function or the fail loop back function can be released by the release signal. As a result, information of, e.g., a flag can be written into the information write space of the block in which writing of information is inhibited. Consequently, the information write space can be effectively used.

Further, according to the semiconductor test apparatus of the present invention, the pattern generation block outputs the release signal with a timing to write information into the cell in the information write space of the block that writing is inhibited by the mask signal and/or a timing to write information into the cell in the write area included in an area in which writing is inhibited by the inhibit signal.

Outputting the release signal with such a timing enables writing arbitrary information such as a flag indicating that a failure cell is included into the information write space which is a redundant space of the block in which writing is inhibited.

Furthermore, according to the semiconductor test apparatus of the present invention, the output controller includes an OR circuit to which the inhibit signal and the mask signal are inputted, an AND circuit to which an output from the OR circuit and the release signal are inputted, and a flip-flop to which an output from the AND circuit is inputted as a reset signal and the write enable signal is inputted as a set signal.

In cases where the output controller adopts such a structure, even if one or both of the inhibit signal and the mask signal are outputted, the write instruction signal can be inputted to the memory device when the release signal is outputted.

Moreover, according to the semiconductor test apparatus of the present invention, the memory device is a flash memory. That is, the present invention is particularly suitable for use in a test of a flash memory.

Additionally, according to the semiconductor test apparatus of the present invention, the release signal is included in a memory device control signal.

With such a structure, using the memory control signal can readily generate the release signal with a timing of a write pattern inputted to the memory device.

BEST MODE FOR CARRYING OUT THE INVENTION

Figure 1:
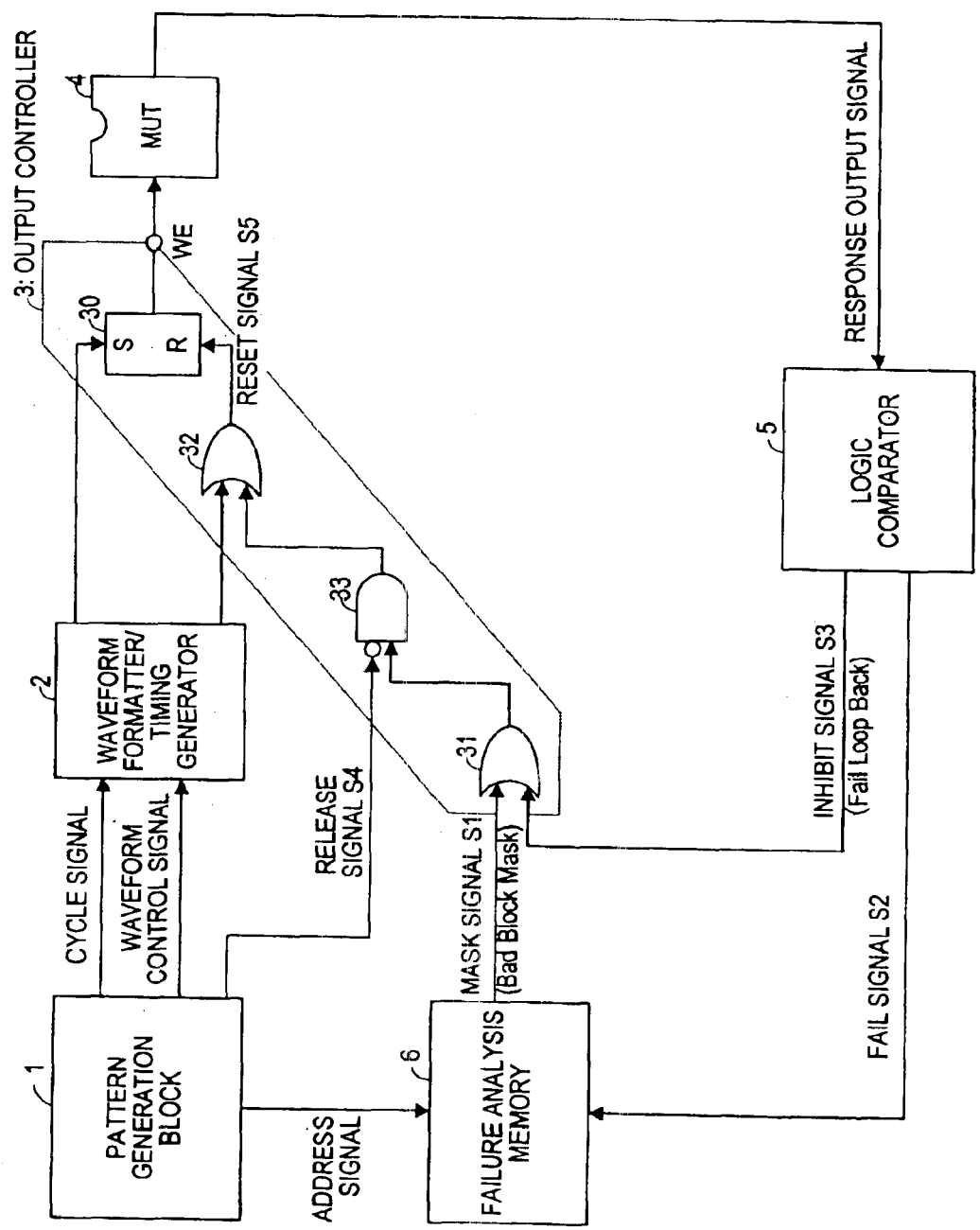
FIG. 1 is a block diagram illustrating a structure of a semiconductor test apparatus according to the present invention.

The present invention will now be described in detail hereinafter with reference to the accompanying drawings.

First, referring to FIG. 1, a structure of a semiconductor test apparatus according to an embodiment will be explained.

This semiconductor test apparatus tests a flash memory (MUT: Memory device Under Test) 4 whose memory area is divided into a plurality of blocks as a device under test, and it is constituted by a pattern generation block 1, a waveform formatter/timing generator 2, an output controller 3, a logic comparator 5 and a failure analysis memory 6 as shown in FIG. 1.

It is to be noted that illustrations and explanations of a delay circuit, a pin electronics and others usually included in the semiconductor test apparatus are omitted in this embodiment.

The pattern generation block 1 generates a cycle signal, a waveform control signal and an expected pattern signal as well as an address signal specifying a write address in the memory device 4.

It is to be noted that the illustration of a transmission path of the expected pattern signal is omitted in FIG. 1.

Moreover, the pattern generation block 1 outputs a release signal S4 which cancels the write inhibit instruction based on an inhibit signal S3 and on a mask signal s1 which will be described later. The release signal S4 is included in a memory device control signal. This release signal S4 is outputted with a timing that information is written into a cell in an information write space of a block in which writing is inhibited by the mask signal S1 and/or a timing that information is written into a cell in a write area included in an area in which writing is inhibited by the inhibit signal S3.

The waveform formatter/timing generator 2 outputs a test pattern signal whose waveform is formatted by the waveform control signal, and also outputs a write enable signal (WE) which enables writing of the test pattern signal into the memory device 4.

The logic comparator 5 compares an output signal outputted from the memory device in response to the input test pattern signal with an expected pattern signal, and detects a failure cell based on a mismatch of the expected pattern signal and the response output signal, thereby outputting a fail signal. It also outputs an inhibit signal which instructs inhibition of writing into a memory area which is tested after a failure cell in the block in which this failure cell is detected.

The failure analysis memory 6 stores failure information at an address indicated by the address signal, and outputs a mask signal which instructs inhibition of writing information into the block in which a failure cell is detected in advance.

Additionally, when one or both of the inhibit signal S3 and the mask signal S1 are inputted, the output controller 3 stops output of the write enable signal (WE) to the memory device in principle.

However, even if one or both of the inhibit signal S3 and the mask signal S1 are inputted, the output controller 3 outputs the write enable signal (WE) when the release signal S4 is inputted.

In order to realize such a function, the output controller 3 is constituted by a flip-flop 30, a first OR circuit 31, a second OR circuit 32 and an AND circuit 33.

The inhibit signal S3 and the mask signal S1 are inputted to the first OR signal 31. Further, an output from the first OR circuit 31 and the release signal S4 are inputted to the AND circuit 33. Furthermore, an output from the AND circuit 33 and a timing signal outputted from the waveform formatter/timing generator 2 are inputted to the second OR circuit 32. Moreover, an output from the second OR circuit 32 is inputted to the flip-flop 30 as a reset signal S5.

Figure 2:
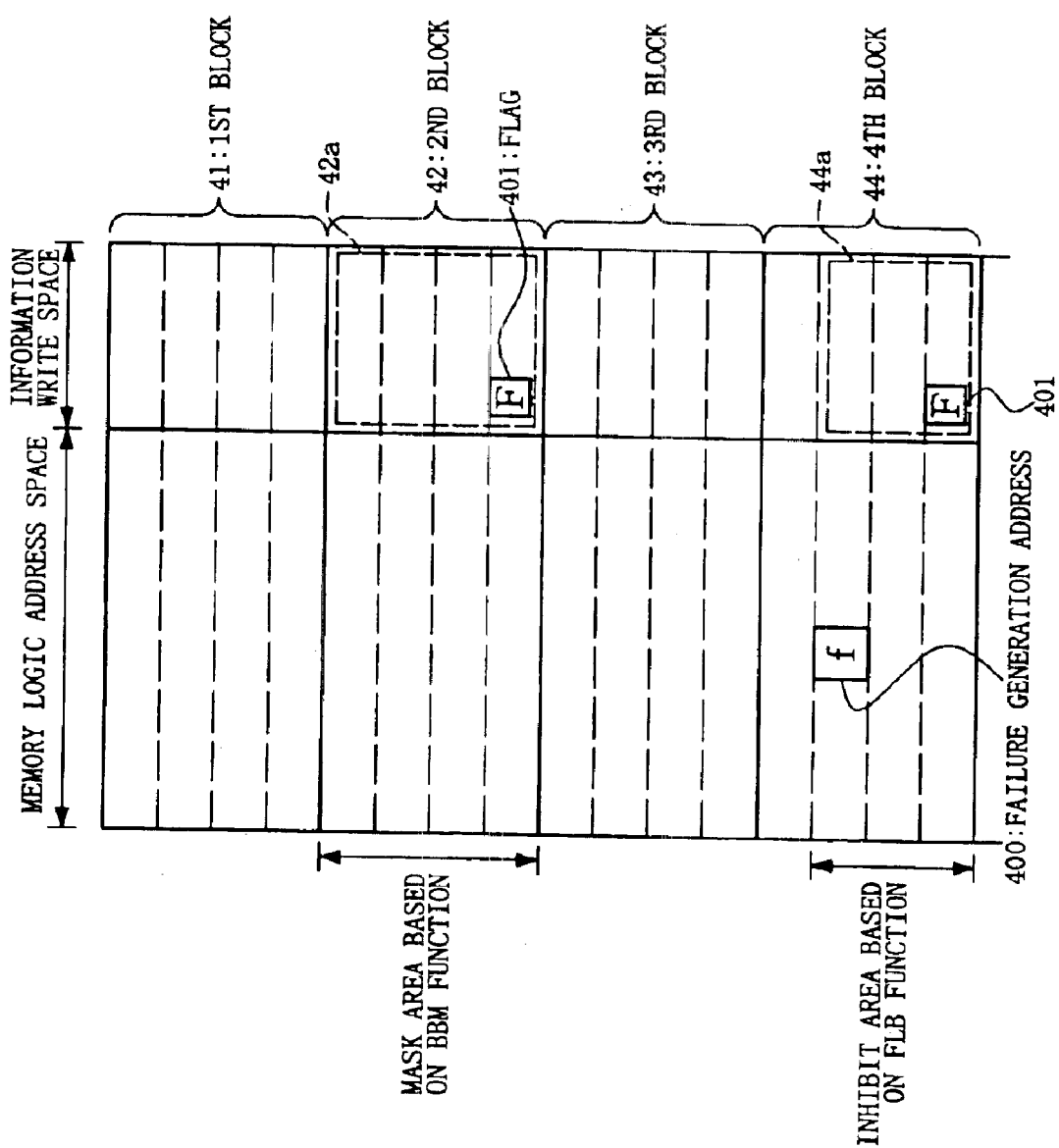
FIG. 2 is a type drawing illustrating a write inhibit area of a memory according to an embodiment of the present invention.

A control example when writing into an address space depicted in FIG. 2 is carried out will now be described with reference to a timing chart of FIG. 3.

Figure 6:
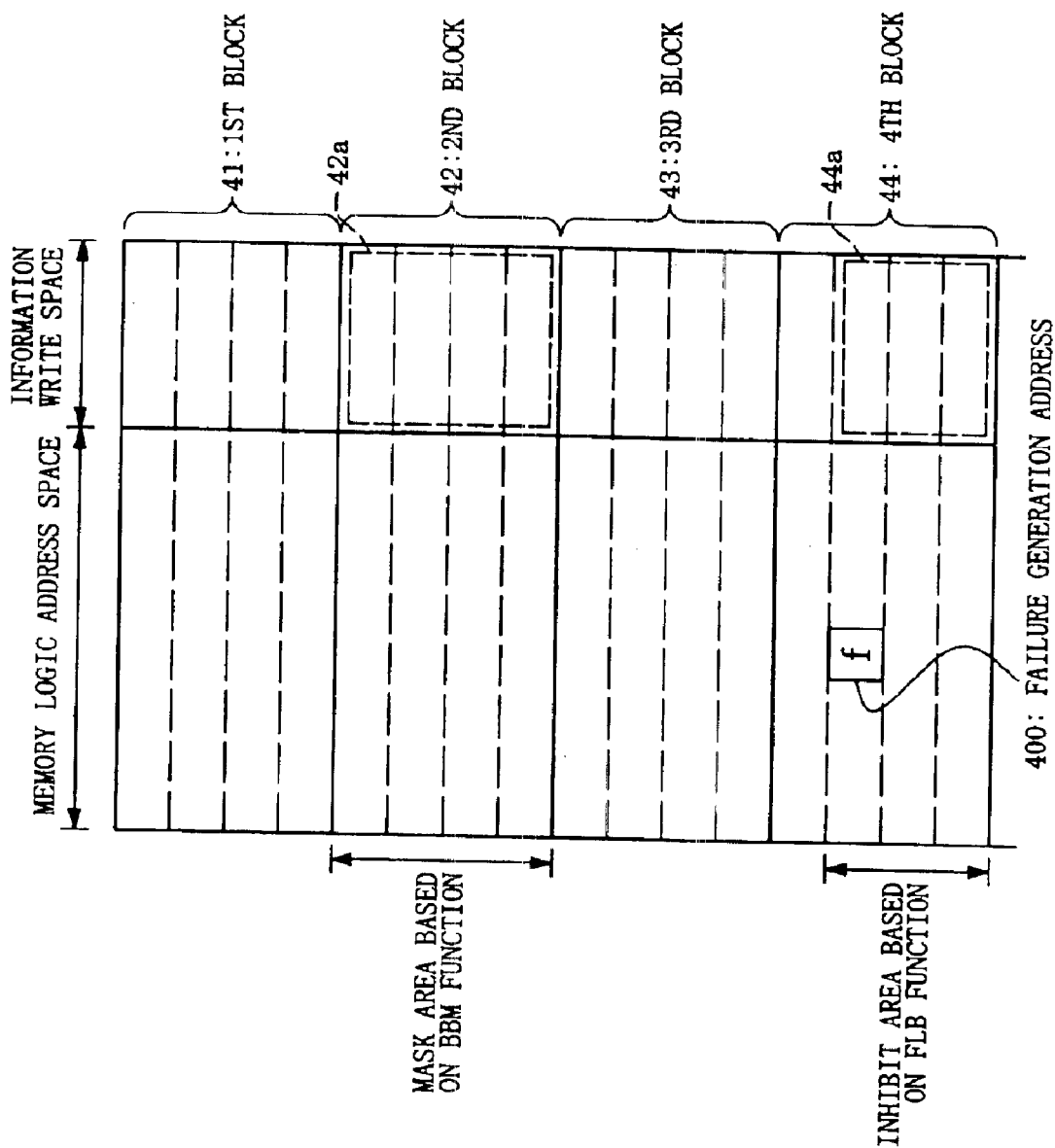
FIG. 6 is a type drawing illustrating a write inhibit area of a memory in a prior art.

The address space of the memory device illustrated in FIG. 2 is divided in to a plurality of blocks (41, 42, 43, . . . ) like one shown in FIG. 6. Each block is constituted by a memory logic address space into which data or the like is written and an information write space which is a redundant space.

Additionally, in the address space depicted in FIG. 2, writing information into an entire second block 42 is inhibited by a bad block mask (BBM) function. Further, since a failure indicated by "f" is detected at a failure generation address 400 in a fourth block, writing information into this block is partially inhibited by a fail loop back (FLB) function.

In this embodiment, a flag indicative of a block including a failure cell is written into each of the information write space of the second block in which writing information is inhibited by the BBM function and the information write space of the fourth block in which writing information is inhibited by the FLB function. Therefore, in this embodiment, the write inhibit state is temporarily released by the release signal.

Figure 3:
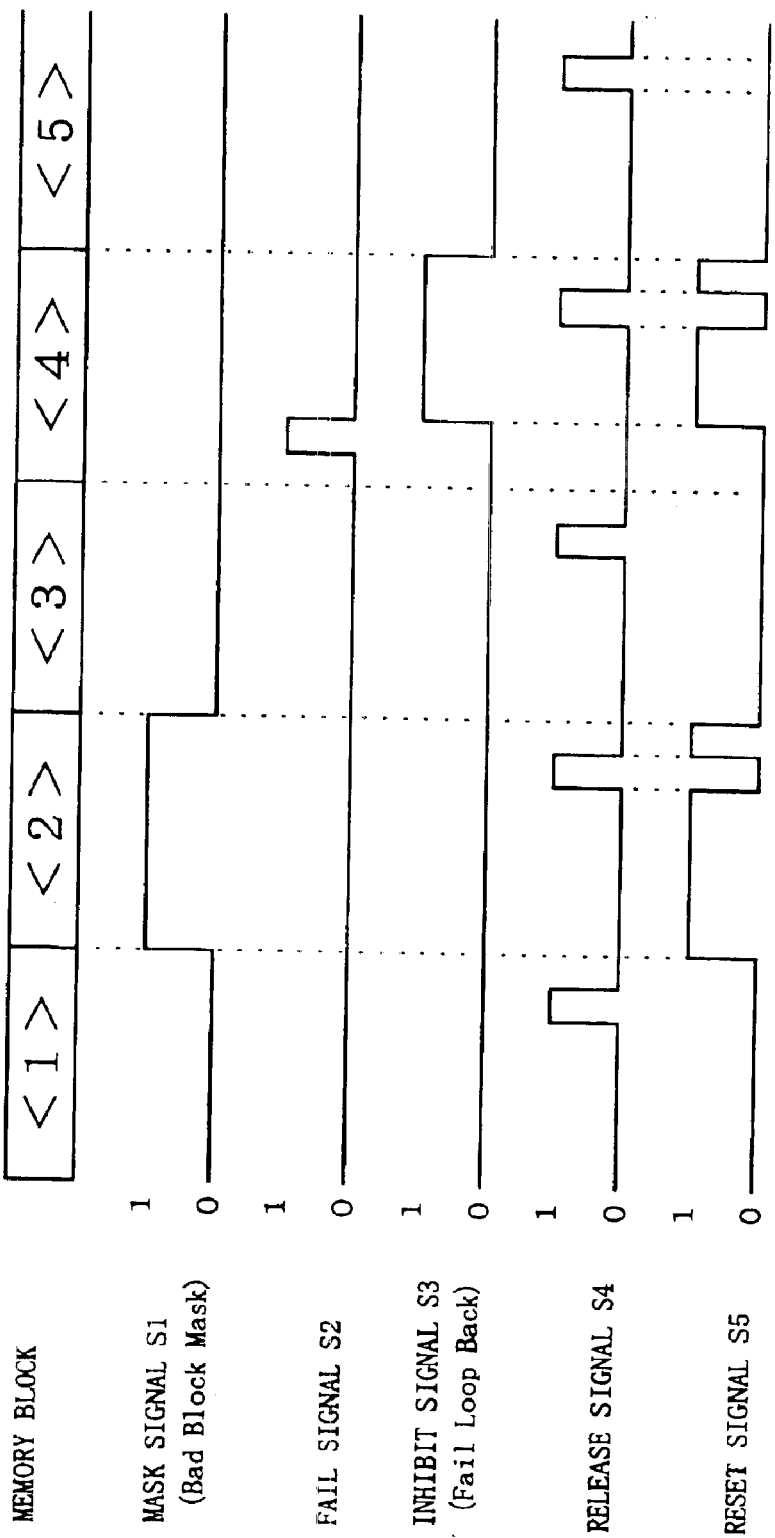
FIG. 3 is a timing chart illustrating an operation of an output controller of the semiconductor test apparatus according to the present invention.

The timing chart of FIG. 3 shows output timings of the mask signal S1 and the inhibit signal S3 inputted to the output controller 3, the reset signal S4 outputted from the output controller 3 and the fail signal S2. Here, a state that a value of each signal is "1" is determined as an output state.

Output timings of the respective signals will now be sequentially described in accordance with each block.

<1> First Block

First, both of the mask signal S1 and the inhibit signal S3 are not outputted in a first block write period. That is, values of the mask signal S1 and the inhibit signal S3 remain as "0". Therefore, an output value of the first OR circuit 31 of the output controller 3 is also "0".

Furthermore, the release signal S4 is output by an instruction of a program during the first block write period. That is, a value of the release signal S4 temporarily becomes "1". As a result, the output value "0" of the first circuit 31 and an inverted value "0" of the release signal S4 are inputted to the AND circuit 33 of the output controller 3, but an output value of the AND circuit 33 becomes "0".

Moreover, a timing signal from the waveform formatter/timing generator 2 and the output value "0"of the AND circuit 33 are inputted to the second OR circuit 32 of the output controller 3. Therefore, a value of the reset signal S5 outputted from the second OR circuit 32 becomes "0" irrespective of a value of the timing signal.

When a value of the reset signal S5 is not outputted, i.e., in a period that a value of the reset signal S5 is "0", writing is not inhibited. Therefore, the flip-flop 30 outputs the write signal outputted from the waveform formatter/timing generator 2 and the test pattern signal including the write enable signal (WE) to the memory device (MUT) 4.

<2> Second Block

In the second block, a failure cell has been already detected by a pre-check or the like. Therefore, in a second block write period, the failure analysis memory 6 outputs the mask signal S1 to the output controller 3 by the bad block mask (BBM) function. That is, a value of the mask signal S1 becomes "1". Therefore, an output value of the first OR circuit 31 of the output controller 3 also becomes "1".

As a result, when a value of the release signal S4 is "0", an output value of the AND circuit 33 becomes "1", and a value of the reset signal S5 outputted from the second OR circuit 32 becomes "1". Therefore, a driver output from the flip-flop 30 is stopped, and writing information into the memory device 4 is inhibited.

In this manner, in a period that the release signal S4 is not outputted, the second block 42 enters the write inhibit state by the bad block mask (BBM) function.

In this embodiment, a flag 401 indicated by "F" in FIG. 2 is written into an information write area 42a of the second block 42 in which writing information is inhibited. Therefore, the release signal S4 is outputted with a timing that this flag 401 is written. That is, a value of the release signal S4 is set to "1". The release signal S4 is outputted as a memory device control signal (MUT control signal) "C0". In a period that the value of the release signal S4 is "1", an output value of the AND circuit 33 becomes "0", and a value of the reset signal S4 outputted from the second OR circuit 32 becomes "0".

An example of a data write pattern into the memory device 4 will now be typically described with reference to FIG. 4.

Figure 4:
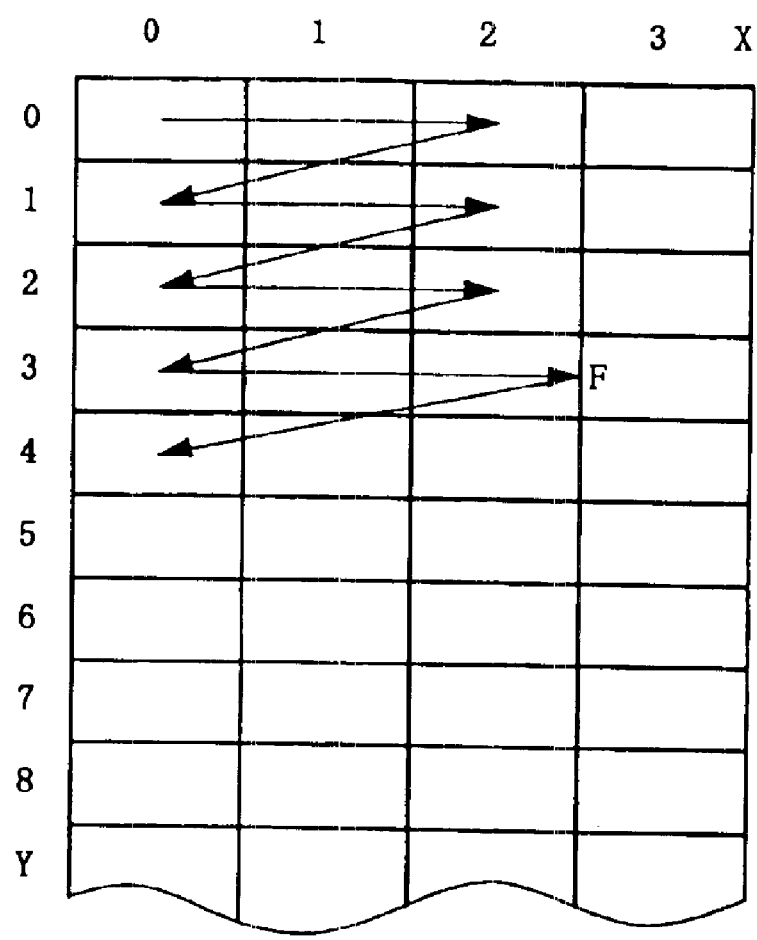
FIG. 4 is a type drawing illustrating an access order in a memory as a device under test.
Figure 5:
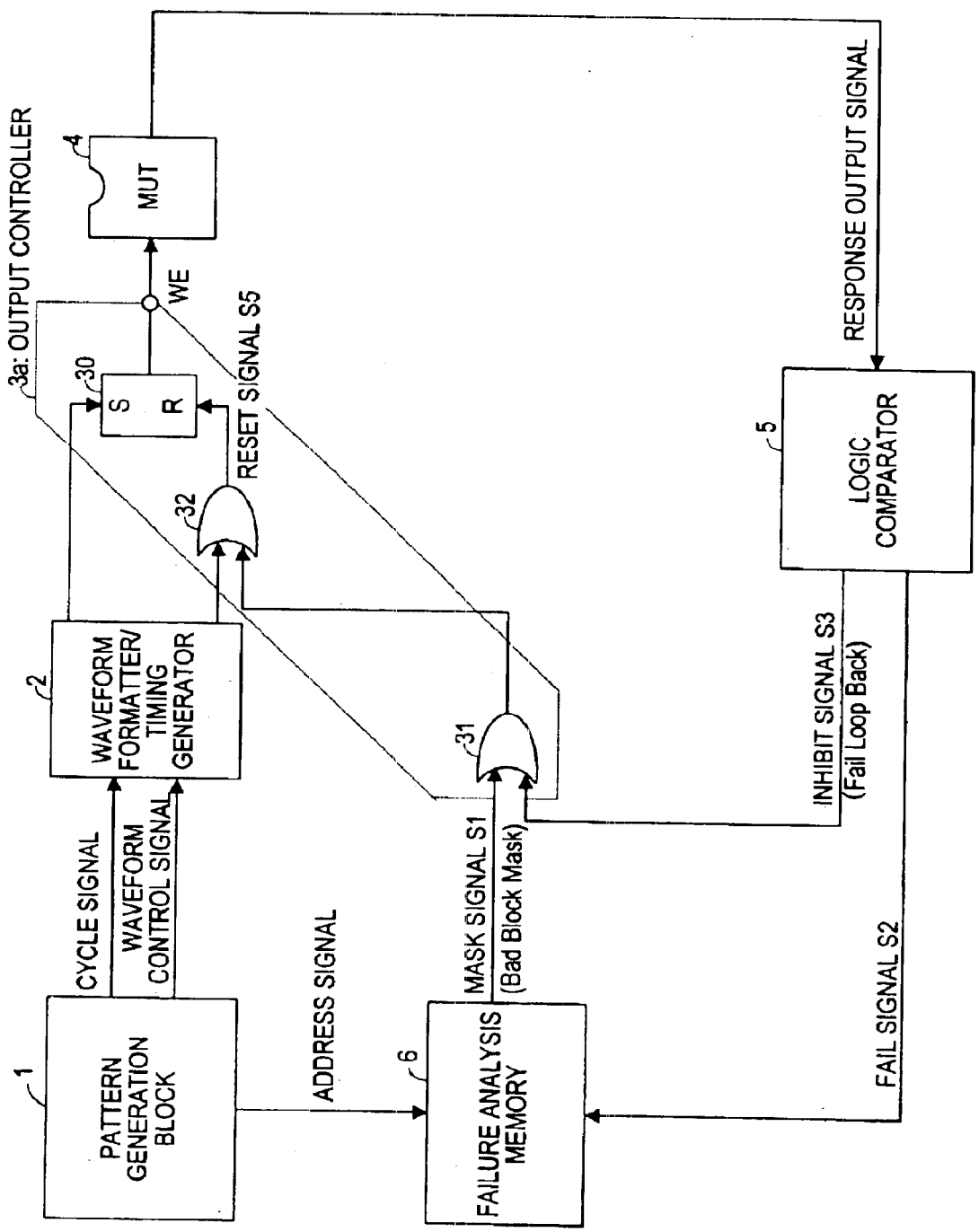
FIG. 5 is a block diagram illustrating a structure of a conventional semiconductor test apparatus.

Areas X=0 to 2 in the address space depicted in FIG. 4 correspond to the memory logic address space shown in FIG. 2, and areas X=3 correspond to the information write space shown in FIG. 2. Here, a description will be given regarding Y=0 to 3 in the address space shown in FIG. 4 as the second block for the convenience's sake.

As data write patterns, examples of (1) of an initial setting pattern of a register and (2) an execution command pattern are given. The data write pattern instructs writing data in the order indicated by arrows shown in FIG. 4.

(1) Initial Setting Pattern

LMAX=#3
XT=#4
YT=#3
IDX8=#C
EXTRA WRITE=C0
CPE=R

"LMAX=#3" in the initial setting pattern indicates that a maximum value of an X address is "#3". Further, "XT=#4" and "YT=#3" indicate that X/Y addresses of the initial value of an information area are respectively stored in XT/YT. Furthermore, "IDX8=#C" specifies a number of times of loop when a command JNI is issued. Moreover, "EXTRA WRITE=C0" typically specifies that writing into the information write space is carried out by an MUT control "C0". Additionally, "CPE=R" specifies that comparison is performed in a cycle "R".

(2) Execution Command pattern

| START #00 | | | | | |
|---|---|---|---|---|---|
| JNI. | X<XB | Y<YB | XB<XB+1 | YB<YB+1^BX | R |
| JNI.−1 | X<XT | Y<YT | YT=YT+4 | C0 | |
| STPS | | | | | |

"START #00" in the above execution command pattern is indicative of a pattern program execution start address. A command "JNI" is executed for a number of times set in an IDX register at a specified position. "." in "JNI." specifies the same row, and "−1" in "JNI.−1" specifies a precedent row. Further, "STPS" is a pattern program end command (SET PASS).

Furthermore, an address of the flag "F" is set in a "C0" description cycle, and the write inhibition is released.

As a result, the processing to inhibit writing information into the second block 42 by the bad block mask (BBM) is temporarily released. Consequently, a flag 401 (FIG. 2) can be written into the information write space 42a in which writing of information is inhibited.

<3>Third Block

A value of each signal in the third block write period is the same as that in the first block write period, thereby omitting a detailed explanation of the operation in this period.

<4>Fourth Block

In the fourth block, a failure cell is detected by the logic comparator 5 during the test. The logic comparator 5 which has detected a failure cell outputs the fail signal S2 to the failure analysis memory 6. That is, a value of the fail signal S2 becomes "1".

Moreover, the logic comparator 5 outputs the inhibit signal S3 to the output controller 3 by the fail loop back function in the second block write period after detection of the failure cell. That is, a value of the *mask signal S1 becomes "1". As a result, an output value of the first OR circuit 31 of the output controller 3 also becomes "1".

Consequently, in a period that a value of the release signal S4 is "0", an output value of the AND circuit 33 is "1"and a value of the reset signal S5 outputted from the second OR circuit 32 is "1". Therefore, a driver output from the flip-flop 30 is stopped, and writing of information into the memory device 4 is inhibited.

In this manner, the fourth block 44 after the failure cell enters the write inhibit state by the fail loop back (FLB) function in a period that the release signal S4 is not outputted.

In this embodiment, the flag 401 indicated by "F" in FIG. 2 is written into the information write area 44a of the fourth block 44 in which writing is inhibited. Therefore, the release signal S4 is outputted with a timing to write the flag 401. That is, a Value of the release signal is set to "1". While a value of the release signal S4 is "1", an output value of the AND circuit 33 becomes "0"and a value of the reset signal S5 outputted from the second OR circuit 32 becomes "0".

As a result, the processing to inhibit writing information into the fourth block 44 by the fail loop back (FLB) function is temporarily released. Consequently, the flag 401 can be written into the information write space 44a in which writing is inhibited.

Since the flag can be also written into the write-inhibited block in this manner, the information write space can be effectively utilized even if the back block mask function or the fail loop back function is used.

Although the description has been given as to the example that the present invention is constituted under the specific conditions in the foregoing embodiment, the present invention can be modified in many ways. For example, the example that the flash memory is a device under test has been described in the above embodiment, but the memory device as a device under test is not restricted to the flash memory in the present invention.

As described above, according to the present invention, the processing to inhibit writing into the block by the bad block mask function or the fail loop back function can be released by the release signal. As a result, even in the state that the writing into the block is inhibited, information such as a flag can be written into the information write space of the block. As a result, a write cycle to write information in the information write space does not have to be added, and information can be written especially in the fail loop back function in that cycle, thereby enabling the faster processing.

INDUSTRIAL APPLICABILITY

As described above, the semiconductor test apparatus according to the present invention, the processing to inhibit writing into the block by the bad block mask function or the fail loop back function can be released by the release signal.

Therefore, the present invention can be optimally used as a semiconductor test apparatus which determines the memory device, e.g., a flash memory as a device under test.

What is claimed is:

1. A semiconductor test apparatus which tests as a device under test a memory device whose memory area is divided into a plurality of blocks, comprising:

a pattern generation block which generates a waveform control signal and an expected pattern signal as well as an address signal specifying a write address in the memory device;

a waveform formatter/timing generator which outputs a test pattern signal whose waveform is formatted by the waveform control signal, and also outputs a write enable signal which enables writing of the test pattern signal into the test memory;

a logic comparator which compares an output signal outputted from the memory device in response to the input test pattern signal with an expected pattern signal, detects a failure cell based on the expected pattern signal and the response output signal and outputs a fail signal, and also outputs an inhibit signal which instructs inhibition of writing into a memory area which is tested after the failure cell in a block in which the failure cell is detected;

a failure analysis memory which stores the failure information at an address indicated by the address signal, and outputs a mask signal which instructs inhibition of writing into a block in which a failure cell is detected in advance; and an output controller which stops output of the write enable signal to the memory device when one or both of the inhibit signal and the mask signal are inputted, wherein the pattern generation block outputs a release signal which cancels the write inhibit instruction based on the inhibit signal and on the mask signal, and the output controller outputs the write enable signal when the release signal is inputted even if one or both of the inhibit signal and the mask signal are inputted.

2. The semiconductor test apparatus according to claim 1, wherein the pattern generation block outputs the release signal with a timing to write information into a cell in an information write space of a block that writing is inhibited by the mask signal and/or a timing to write information into a cell in a write area included in an area that writing is inhibited by the inhibit signal.

3. The semiconductor test apparatus according to claim 1, wherein the output controller includes:

an OR circuit to which the inhibit signal and the mask signal are inputted;

an AND circuit to which an output of the OR circuit and the release signal are inputted; and a flip-flop to which an output of the AND circuit is inputted as a reset signal and the write enable signal is inputted as a set signal.

4. The semiconductor test apparatus according to claim 1, wherein the memory device is a flash memory.

5. The semiconductor test apparatus according to claim 1, wherein the release signal is included in a memory device control signal.

* * * * *